United States Patent [19]

Thorn et al.

[11] 4,087,798

[45] May 2, 1978

[54] DEVICE AND METHOD FOR DETERMINING THE PRESENCE OF RESONANT MATERIALS

[75] Inventors: Donald C. Thorn; Glenn A. Atwood, both of Akron, Ohio

[73] Assignee: The University of Akron, Akron, Ohio

[21] Appl. No.: 667,821

[22] Filed: Mar. 17, 1976

[51] Int. Cl.² .................. G08B 17/10; G01R 27/04; H01P 7/06
[52] U.S. Cl. .................. 340/237 R; 324/58.5 C
[58] Field of Search .............. 340/237 R; 324/58 C, 324/58.5 C, .5 A, .5 AC

[56] References Cited

U.S. PATENT DOCUMENTS

| | | | |
|---|---|---|---|
| 2,580,968 | 1/1952 | Sproull | 324/58 C |
| 2,792,548 | 5/1957 | Hershberger | 324/58.5 C |
| 2,849,613 | 8/1958 | Dicke | 324/58.5 C |
| 2,933,696 | 4/1960 | Reder et al. | 324/58.5 C |
| 3,458,808 | 7/1969 | Agdur | 324/58.5 C |
| 3,998,557 | 12/1976 | Javan | 356/205 |

*Primary Examiner*—John W. Caldwell, Sr.
*Assistant Examiner*—Daniel Myer
*Attorney, Agent, or Firm*—Hamilton, Renner & Kenner

[57] ABSTRACT

A spectroscopic refractometer has a plurality of resonant cavities through which the environment to be sampled may pass, including a first resonant cavity constructed and tuned to resonate at a transition frequency of the resonant material of interest and a second resonant cavity constructed and tuned to resonate at a nontransition frequency closely associated to the transition frequency to which the first resonant cavity is tuned. The resonant cavities are excited by electromagnetic oscillations corresponding in frequency to the transition and the nontransition frequency. A corrrelating parameter, such as frequency difference, is determined between the signals within the first and second resonant cavities, which in the absence of the resonant material of interest has a constant value. In the presence of the resonant material of interest a change in the value of the correlating parameter is detected and subsequently compared with the constant value of the correlating parameter so as to determine the presence of the resonant material of interest.

18 Claims, 2 Drawing Figures

DEVICE AND METHOD FOR DETERMINING THE PRESENCE OF RESONANT MATERIALS

BACKGROUND OF THE INVENTION

The present invention relates generally to a device and method for determining the presence of specific materials in the environment. More particularly, the present invention relates to a spectroscopic refractometer and method for uniquely determining the presence of materials exhibiting resonance characteristics in the presence of specific electromagnetic oscillations.

Refractometers are well known devices for investigating phenomena causing varations in the refractive indices of various elemental and molecular species. Heretofore, the utilization of refractometers has been limited to the evaluation of the dielectric constant of solids, liquids and gases from the measurement of the fractional change in resonant frequencies between cavities containing (1) a highly stabilized reference sample, whose frequency and dielectric constant are fixed, and (2) the test sample itself.

One device known in the prior art operating in the microwave region of the electromagnetic spectrum utilizes two microwave frequency resonant cavities of either the absorption or transmission type excited in parallel by a frequency modulated linear microwave oscillator such as a modulated reflex klystron. One resonant cavity, which may be sealed under vacuum, functions as a frequency reference while the other resonant cavity, with a slightly different resonant frequency, has a test sample inserted therein. The output signal of each separate resonant cavity is applied to separate crystal detectors. The output signals of the detectors are displaced in time from each other, as a result of both the difference in the resonant frequencies of the cavities and the dielectric constant of the materials therein. Next, the displacement time between the output signal of each detector is measured from which the dielectric constant of the test sample may be calculated as a function of the fractional change in time beyond that normally provided by the difference in the resonant frequencies of the resonant cavities. The critical necessity for a linear proportionality relation between displacement time and the frequency difference between the cavities results in a device which is extremely sensitive to temperature, pressure, and detector component linearity and stability.

Another known device utilized to measure small changes in the refractive index of dielectric materials operating in the microwave region of the electromagnetic spectrum comprises two microwave frequency resonant cavities of the reflection type each individually excited by separate stabilized microwave oscillators such as a reflex klystron whose frequency is controlled by the resonant frequency of its associated resonant cavity. One resonant cavity which is sealed and may be enclosed in a vacuum, functions as a frequency reference while the other resonant cavity, with a slightly different resonant frequency, has parallel perforated end plates enabling injection of a test sample. The output signals of the two stabilized oscillators are transmitted through a microwave waveguide of the appropriate geometry which couples the output signals in an offshoot waveguide (known in the art as a hybrid "T" junction or "magic tee") and applied to a crystal detector whose output is appropriately displayed. Since the output of the detector is a heterodyne beat frequency proportional to the difference in the resonant cavity controlled oscillator frequencies, a change in the dielectric properties of the test sample which produces a proportional change in the sample cavity oscillator frequency can therefore be calculated from the measurement of a proportional change in the detected heterodyne beat frequency.

All such prior art devices must, of necessity, employ a frequency reference resonant cavity if small changes in the refractive index of dielectric materials are to be accurately measured. Also, all such prior art devices require complex setup and calibration procedures, require technically competent personnel to interpret results, and prove quite costly to construct and operate. Additionally and most importantly, the devices are incapable of the unique identification of specific testing materials since any given dielectric constant might be exhibited by any of several materials individually or in combination with other materials.

In the field of spectroscopy, it is generally known that certain elemental and molecular species exhibit resonant characteristics when excited by an oscillating electromagnetic field of specific frequencies. These resonant characteristics are exhibited only when the frequency of the oscillation is such that the energy the molecule emits or alternatively absorbs corresponds to that necessary to induce a transition between energy levels of the molecule. Further, such transitions occur in at least three exemplary modes — rotational, vibrational, and electronic — and may occur throughout the frequencies of the entire electromagnetic spectrum for any given resonant material of interest. Since it is known that each material is characterized by its own unique molecular energy level structure, each material exhibits its own unique combination of transition frequencies and such transition frequency spectra are readily available for a wide variety of materials.

It should be noted that many hazardous environmental materials exhibit the aforesaid resonant characteristics. Thus, a device and method for uniquely determining the presence of resonant materials as herein disclosed could be utilized to determine the presence of anesthetics such as ethyl ether or the more commonly employed halogen containing compounds which can escape within hospital operating rooms, the presence of either the noxious oxides of sulfur (e.g., $SO_2$ and $SO_3$) or freons in a plant or in the general outdoor atmosphere, or the presence of chlorocarbons such as vinyl chloride in an industrial plant to name but a few.

We have found that an improved refractometer device, which may be referred to as a spectroscopic refractometer, may, therefore, be utilized to uniquely determine the presence of specific resonant materials. Unlike the prior art refractometers which are utilized for the evaluation of dielectric constants, the spectroscopic refractometer uniquely determines the presence of resonant materials by the measurement of the fractional change in the value of a correlating parameter such as the frequency between two resonant cavities whose frequencies are related by the constant value in the absence of the resonant material of interest and whose frequencies are variably related in the presence of the resonant material of interest. Since the two resonant cavities are related by a constant magnitude of the difference frequency at all times other than in the presence of the resonant material of interest, the spectroscopic refractometer is relatively insensitive to temperature, pressure, and detector component linearity, is relatively simple to set up and calibrate, is relatively inexpensive to construct and operate, and may be utilized and operated by laymen to provide a unique determination of the presence of resonant materials.

SUMMARY OF THE INVENTION

It is, therefore, a primary object of the invention to provide a method and device for uniquely determining the presence of materials exhibiting resonant characteristics in the presence of electromagnetic oscillations.

It is another object of the invention to provide a method and device for uniquely determining the presence of resonant materials, as above, wherein an environment which may contain a resonant material of interest is allowed to pass through a plurality of resonant cavities, having a constant value of a correlating parameter such as the difference in cavity frequencies in the absence of the resonant material of interest.

It is still another object of the invention to provide a method and device for uniquely determining the presence of resonant materials, as above, wherein a change in the value of the correlating parameter, such as a change in the difference in cavity frequencies, is detected and compared with the constant value of the correlating parameter so as to determine the presence of the resonant material of interest.

It is still a further object of the invention to provide a method and device for uniquely determining the presence of resonant materials, as above, including a plurality of resonant cavities through which an environment which may contain a resonant material of the interest may pass, without the necessity for utilizing a highly stabilized reference resonant cavity whose frequency need be accurately and precisely known.

An additional object of the invention is to provide a method and device for uniquely determining the presence of resonant materials, as above, which is relatively insensitive to temperature, pressure, and detector component linearity, is relatively simple to set up and calibrate, is relatively inexpensive to construct and operate, and may be utilized and operated by laymen.

The above and other objects and advantages of the invention will become more apparent and fully understood from the following description in conjunction with the accompanying drawings.

In general, a device and method embodying the concept of the present invention comprise a plurality of resonant cavities through which the environment to be sampled may pass, including a first resonant cavity tuned to resonate at a transition frequency of the resonant material of interest and a second resonant cavity tuned to resonate at a nontransition frequency closely associated to the transition frequency to which the first resonant cavity is tuned. The resonant cavities are excited by electromagnetic oscillations corresponding in frequency to the transition and nontransition frequency. A correlating parameter, such as frequency difference, is determined between the signals within the first and second resonant cavities, which in the absence of the resonant material of interest has a constant value. In the presence of the resonant material of interest a change in the value of the correlating parameter is detected and subsequently compared with the constant value of the correlating parameter so as to determine the presence of the resonant material of interest.

DESCRIPTION OF THE PREFERRED EMBODIMENT

Figure 1:
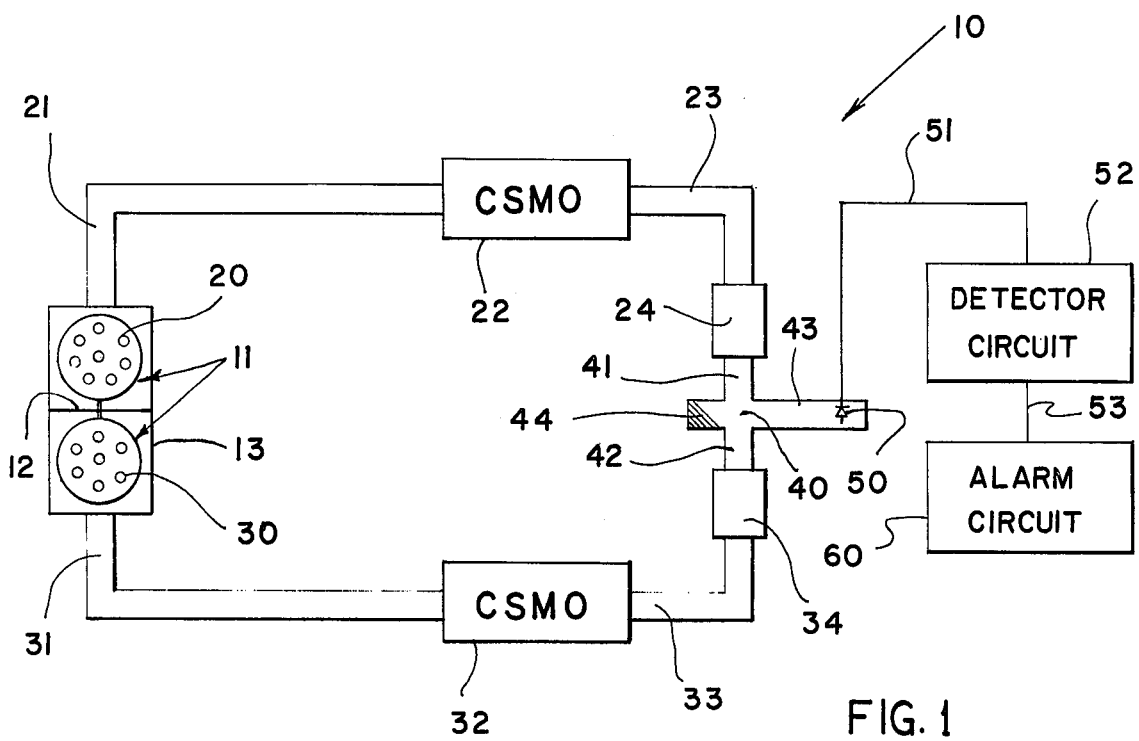
FIG. 1 is a schematic diagram of a device embodying the principles of the present invention and utilizing frequency difference as the correlating parameter.

FIG. 1 schematically depicts a device for determining the presence of resonant materials and is generally indicated by the numeral 10. The device 10 includes at least one cavity grouping 11, each grouping 11 having at least two cavity resonators 20, 30 through which the material to be identified may pass, or be injected, or placed therein. In order to facilitate sampling of an environment, in this instance the atmosphere, cavity resonators 20, 30 may be joined and mounted by any suitable means, such as by cross member 12, within an air duct 13, such as may be found in the ventilation system of any building or industrial plant facility.

Since a single physically defined cavity may simultaneously operate in more than one electromagnetic mode and at more than one frequency, at least one cavity grouping 11 may be effectuated in a single physically defined cavity. Therefore, as utilized in this specification and the appended claims "cavity" is to be taken as denoting, inter alia, an electromagnetically defined space region which may be simultaneously occupied by a plurality of electromagnetic oscillations of different modes and frequencies, rather than a separate physically defined space region which may only be occupied by electromagnetic oscillations of a single mode and frequency.

Cavity resonators 20, 30 may be conventional high Q resonant cavities and must be constructed and tuned so as to permit resonance at the desired frequencies. It is to be clearly understood, as already explained, that device 10 may be constructed for operation at any frequency or range of frequencies throughout the entire electromagnetic spectrum at which a transition exists associated with the resonant material of interest and in any permissible mode at the selected frequency or within the range of frequencies. Strictly for purposes of illustration, the preferred embodiment shall depict device 10 as operating esssentially within the microwave region of the electromagnetic spectrum. By way of example, where one was desirous of determining the presence of vinyl chloride, one cavity resonator, such as cavity resonator 20, may be constructed and tuned so as to permit resonance at any one of the transition frequencies associated with vinyl chloride, although it is preferable to select the frequency with the greatest transition energy change within the range of microwave frequencies in which the equipment is most convenient to operate, such as the transition frequency of 23.540 GHz.

Cavity resonator 30, as the second cavity resonator included in cavity grouping 11, must be constructed and tuned so as to permit resonance at a nontransition frequency closely associated to the transition frequency to which cavity resonator 20 is constructed and tuned. The nontransition frequency of cavity resonator 30 must not be substantially equal to any other transition frequency of the resonant material of interest and may preferably be separated from the transition frequency of cavity resonator 20 by an amount which the detector described hereinafter may easily and precisely detect. Additionally, both the transition and the nontransition frequency of cavity resonators 20, 30 respectively, must not be substantially equal to the transition frequency of any other resonant material which may be present, although this requirement may generally be met by selection of a nontransition frequency just beyond the frequency band surrounding the selected transition frequency, which band is determined by the sensitivity of device 10 and the magnitude of the energy change at the selected transition frequency.

Since in the vinyl chloride example there are no adjacent transition frequencies to that of the selected transition frequency of cavity 20, 23.540 GHz, at or within approximately ±5 MHz, assuming no other resonant materials which may be present have transition frequencies therebetween, cavity resonator 30 may be constructed for and tuned to resonate at any frequency at or within approximately ±5 MHz of the selected transition frequency of 23.540 GHz, such as at 23.535 GHz. A plurality of cavity resonators similar to cavity resonators 20, 30 may be included in cavity grouping 11 where higher selectivity is required.

Conductors such as microwave waveguides 21, 31, connect cavity resonators 20, 30, respectively, to cavity stabilized microwave oscillators (hereinafter CSMO) 22, 32, respectively. CSMO 22, 32 may include any of the well-known tunable microwave frequency signal generators, such as a reflex klystron, Gunn effect oscillator, or an avalanche transit-time device as a Read diode in conjunction with any of the equally well-known cavity frequency or phase feedback stabilization systems with acceptable stability and tuning range characteristics as is required for similar microwave frequency spectroscopic devices. One such cavity frequency feedback stabilization system is that presented by R. V. Pound in the article entitled "Frequency Stabilization of Microwave Oscillators," 35 Proceedings of The Institute of Radio Engineers 1405, a copy of which may be found in most technical libraries throughout the world.

Microwave waveguides 21, 31 may be conventional microwave waveguides with an appropriate, cross-sectional geometry, such as rectangular, to permit propagation of the aforesaid desired microwave frequencies and electromagnetic energy propagation modes. When utilizing a 23.535 GHz transition frequency as associated with the vinyl chloride example herein, a conventional K band (18.00 GHz to 26.50 GHz) rectangular waveguide would suffice.

Conductors, such as microwave waveguides 23, 33, similar to microwave waveguides 21, 31, connect CSMO 22, 32, respectively, through isolators 24, 34, respectively, to opposite reference arms 41, 42, respectively, of a "magic tee" junction 40, similar to the conventional "magic tee" heretofore described. Isolators 24, 34 may be conventional microwave ferrite isolators and can be included, if desired, to prevent coupling between CSMO 22, 32, respectively. A detector 50, which may be at least one conventional diode with ultra high frequency detection characteristics, may be mounted within sampling arm 43 opposite absorptive termination 44 of "magic tee" junction 40 to furnish a signal, the characteristics of which shall be described hereinafter, through conductor 51, which may be conventional coaxial cable, to detector circuit 52. Detector circuit 52 may also be a conventional detector frequently including amplifier, limiter, and discriminator circuits. Although numerous detector circuits should be readily apparent to the skilled artisan, one suitable detector circuit may be found described in the RCA Receiving Tube Manual, published by the Radio Corporation of America in 1950, at pages 272–273. A conventional alarm circuit 60, such as a buzzer and flashing light, may be connected to detector circuit 52 by conductor 53 so as to provide a visual and/or audio alarm signal to operating personnel upon the presence of concentrations of the suspect material within cavity resonators 20, 30. Additionally or alternately, alarm circuit 60 may include a continuous video display device, such as an oscilloscope, and/or a signal recorder such as an X-Y plotter, where continuous and perhaps hard copy outputs are desired.

It should now be noted that although unique identification of materials is possible with the device and method herein described, such identification may require the same number of cavity groupings with their associated microwave oscillators as the number of transition frequencies associated with the material of interest for unique identification as heretofore explained. An acceptable probability of unique identification may be obtained much more economically and with far less complexity by the utilization of a selected transition frequency that is unique to the material of interest with respect to all those materials likely to be sampled with the material of interest. Thus, the transition frequency spectrum of those materials likely to be present in the atmosphere with vinyl chloride, for example, may be compared with the transition frequency spectrum of vinyl chloride so as to yield that frequency at which the only transition which would be observed would be that of vinyl chloride. Of course, where there is no single unique frequency available, the number of devices 10 may be increased until an acceptably high probability of unique identification is obtained.

Referring to FIG. 1, an exemplary method for determining the presence of resonant materials employing device 10 in the arrangement depicted could proceed as hereinafter set forth. First, cavity resonators 20, 30 are excited with microwaves of the above specified frequencies. As a result, microwave signals substantially of the same frequencies to which CSMO 22, 32 are tuned (here 23.540 GHz and 23.545 GHz, respectively), are propagated through waveguides 23, 33, isolators 24, 34 and input arms 41, 42 of "magic tee" junction 40, respectively, to output arm 43.

Next, as is well-known to those skilled in the art, detector 50 detects the magnitude of the difference frequency between these signals (hereinafter called the "heterodyne beat frequency" or simply "beat frequency"), generates a signal proportional thereto (which signal would here have a frequency of substantially 5 MHz), and transmits the beat frequency signal to detector circuit 52 via conductor 51. Detector circuit 52 processes the beat frequency signal by any of the established detection techniques to enable alarm circuit to operate as explained below. This process of generating and processing a beat frequency signal shall henceforth be referred to as "detection."

As the materials which pass through cavity resonators 20, 30 change a shift occurs in the frequencies at which CSMO 22, 32 oscillate as a result of the change in the dielectric properties associated therewith. However this shift is substantially identical for both oscillators since the change in the dielectric characteristics of the materials passing therethrough are also substantially identical due to the close physical proximity of cavity resonators 20, 30 within air duct 13, thereby resulting in a substantially constant value of the correlating parameter — a constant beat frequency signal — in the absence of the resonant material of interest, here vinyl chloride. This substantially constant value of the correlating parameter may thus be determined either empirically through detection by device 10 as explained or theoretically by a simple calculation of the magnitude of the difference between the frequencies to which CSMO 22, 32 are tuned.

In the presence of vinyl chloride, the operating frequencies of cavity resonators 20, 30 will shift by different amounts resulting in a similar difference in frequency shift between CSMO 22 and CSMO 32, thereby effectuating a variation in the value of the correlating parameter, that is, a different beat frequency than that detected in the absence of vinyl chloride. This varied value of the correlating parameter, may at this point in time be detected by device 10 as explained.

Next, a comparison of the detected variation in the value of the correlating parameter with the determined substantially constant value of the correlating parameter may be made, with any difference therebetween indicative of the presence of vinyl chloride. Here, by constructing the alarm circuit 60 to operate at all times other than those times during which the processed beat frequency signal from detector circuit 52 is substantially equal to that generated in the absence of vinyl chloride, an alarm may be received whenever vinyl chloride is present in sufficient concentrations.

Occasionally other materials not of interest may be present within the sampled environment over such a large range of concentrations that the operating frequency of transition cavity resonator 20 is shifted beyond the selected transition frequency to such an extent that device 10 may be rendered incapable of determining the presence of the resonant material of interest. For example, in the microwave region of the electromagnetic spectrum the most frequently naturally occurring material which may be present over a large range of concentrations is water, which typically may vary from as low as 5% to 100% relative humidity. We have found the simplest remedy for such difficulties is to condition the sampled environment so as to constrain the concentration of such materials within an acceptable range of variations with which device 10 may be designed to operationally adjust. Thus the concentration of water within the sampled environment may be maintained at any desired substantially constant level by dehumidification or humidification, to name but two known techniques.

Where these condition techniques are impractical, device 10 may be modified to incorporate conditioning circuitry as will now be described with reference to FIG. 2. A conventional highly stabilized, frequency reference, sealed cavity resonator 70 controls a CSMO 71 and is connected thereto by waveguide 72. CSMO 71 is connected via waveguide 73 to each of one input arms of "magic tee" junctions 80, 90. The opposite input arms of "magic tee" junctions 80, 90 are connected to CSMO 22, 32 respectively via waveguides 81, 91 and 23, 33 respectively. Isolators 82, 83 and 92, 93 may be interposed between the incoming waveguides and the input arms of "magic tee" junctions 80, 90 respectively. Detectors 84, 94 may be mounted within the output arms of "magic tee" junctions 80, 90 respectively and connected to cavity tuners 85, 95 respectively, by coaxial conductors 86, 96 respectively. Cavity tuners 85, 95 each drive a cavity resonator retuning apparatus such as pins 87, 97 respectively which are partially movably inserted within cavity resonators 20, 30 respectively. Cavity tuners 85, 95 may be conventional servo systems which drive a mechanical assembly proportional to some parameter of an input signal, which here is frequency, and provide an output signal proportional to the position of the mechanical assembly. An exemplary servo system including a frequency discriminator suitable for use herein is described in U.S. Pat. No. 2,933,696 by Reder, et al. Alarm circuit 60 is connected to cavity tuners 85, 95 by conductors 53A and 53B respectively.

Basically the conditioning circuitry operates as follows: Upon excitation of cavity resonators 20 and 70 detector 84 generates a beat frequency substantially equal to the magnitude of the difference frequency between the operating frequencies of CSMO 22 and 71, in a manner similar to that by which detector 50 generates a beat frequency substantially equal to the magnitude of the difference frequency between the operating frequencies of CSMO 22 and 32. Cavity tuner 85 processes this signal and drives cavity resonator retuning pin 87 further into or out of cavity resonator 20 as required, thereby retuning cavity resonator 20 so as to force CSMO 22 to return to the desired transition frequency.

In a like manner, upon excitation of cavity resonators 30 and 70, detector 94 generates a beat frequency substantially equal to the magnitude of the difference frequency between the operating frequencies of CSMO 32 and 71. Cavity tuner 95 processes this signal and drives cavity resonator retuning pin 97 further into or out of cavity resonator 30 as required, thereby retuning cavity resonator 30 so as to force CSMO 32 to return to the desired nontransition frequency. By constructing the alarm circuit 60 to operate at all times other than those times during which the fractional change in the output signals of cavity tuners 85 and 95 are substantially equal, an alarm may be received whenever vinyl chloride is present in sufficient concentrations.

CSMO 71 and its associated cavity resonator 70 may be tuned to any frequency within the frequency range including the selected transition and nontransition frequencies. For example, CSMO 71 and its associated cavity resonator 70 may be tuned to an intermediate frequency halfway between the transition and nontransition frequencies so as to generate a constant beat frequency in detector 84 when cavity resonator 20 is operating at the transition frequency and generate a substantially equal constant beat frequency in detector 94 when cavity resonator 30 is operating at the nontransition frequency.

Figure 2:
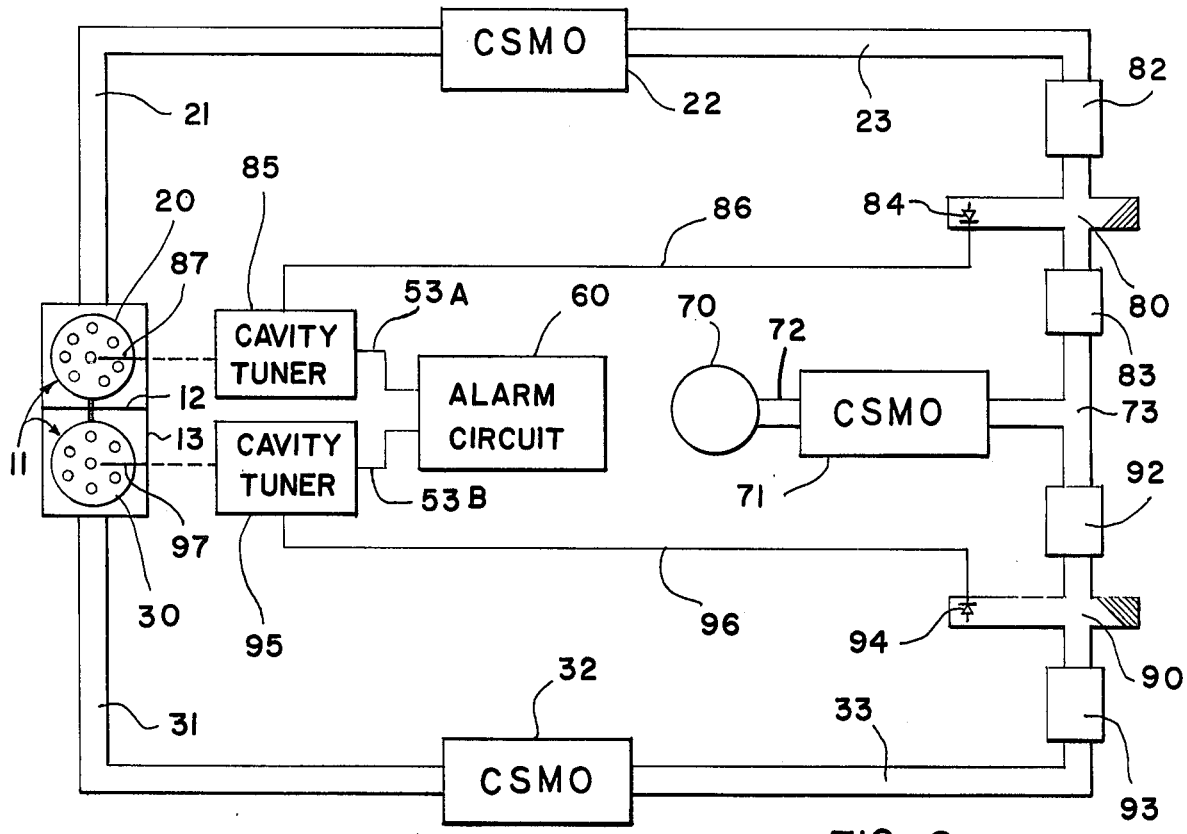
FIG. 2 is a schematic diagram of a device embodying the principles of the present invention in which exemplary conditioning circuitry is provided.

Although not depicted in FIG. 2, many other alarm schemes may be effectuated with similar conditioning circuitry as described herein. One example might include beating the generated beat frequency signal from detector 84 with the generated beat frequency signal from detector 94, the presence of the resonant material of interest being determined by a transient change in the value of this new beat frequency signal from the determined constant value in the absence of the resonant material of interest.

It must be clearly understood that any cavity resonator retuning feedback circuit well-known in those frequency ranges in which the device is designed to operate must be utilized in place of the particular condition circuit just described. Conditioning may either be continuous or, alternatively, intermittently accomplished.

It should be expressly noted that the above embodiment modifications may be made thereto in order to effectuate a self-telemetered device for determining the presence of materials of interest, thereby reducing the quantity of equipment at the sampling site. For example, the "magic tee" sampling arm 43 may be connected to a microwave transmitting antenna (not shown) in place of detector 50, allowing the stabilized microwave oscillator frequencies to propagate through space to a remotely located similar microwave receiving antenna whereupon the previously explained detection and alarm functions may be carried out.

Also to be noted is another modification evident to all those skilled in the art: A single detector circuit 52 and alarm circuit 60 may receive multiplexed beat frequencies from a plurality of cavity groupings in either the "hard wired" configuration depicted in the drawing or the self-telemetered remotely controlled configuration just discussed, thereby substantially reducing the cost associated with the construction of separately located multiple cavity grouping systems.

Although in the preferred embodiment a frequency difference was utilized as a correlating parameter, such a parameter is only representative of many types of permissible correlating parameters. For example, the concept of the present invention could be implemented using a time delay correlating parameter, a cavity resonator Q correlating parameter, a phase shift correlating parameter, an attenuation correlating parameter, or any combination thereof to name only a few.

Inasmuch as the present invention is subject to many variations, modifications and changes in detail, a number of which have been expressly stated herein, it is intended that all matter described throughout this entire specification or shown in the accompanying drawings be interpreted as illustrative and not in a limiting sense.

What is claimed is:

1. A method for determining the presence and unique identity of materials exhibiting resonant characteristics comprising the steps of:
   tuning a plurality of resonant cavities, at least a first said resonant cavity to a transition frequency of said resonant material and at least a second said resonant cavity to a nontransition frequency closely associated to said transition frequency;
   passing the resonant material through at least said first and second resonant cavities;
   exciting said first and second resonant cavities with electromagnetic oscillations corresponding in frequency to said transition and said nontransition frequency, respectively;
   determining the constant value of a correlating parameter between the signals within said first and said second resonant cavities existing in the absence of said resonant material;
   detecting the value of the correlating parameter between the signals within said first and said second resonant cavities existing in the presence of said resonant material;
   and comparing the values of said correlating parameter
   so as to determine the presence and unique identity of the material.

2. A method, as in claim 1, wherein said transition frequency and said nontransition frequency are frequencies in the microwave region of the electromagnetic spectrum.

3. A method, as in claim 1, wherein the steps of determining said constant value of the correlating parameter and detecting the value of the correlating parameter include the respective steps of determining and detecting the magnitude of the difference frequencies between said electromagnetic oscillations within said first and second resonant cavities.

4. A method, as in claim 1, further comprising the step of preventing shifting of the frequencies at which said first and second resonant cavities are operating of such an extent that the presence of the material would be rendered indeterminable.

5. A method, as in claim 4, wherein the step of preventing includes conditioning the environment prior to its passing through said plurality of resonant cavities.

6. A method for determining the presence and unique identity of materials exhibiting resonant characteristics comprising the steps of:
   tuning a plurality of resonant cavities, at least a first said resonant cavity to a transition frequency of said resonant material, at least a second said resonant cavity to a nontransition frequency closely associated to said transition frequency, and at least one sealed said resonant cavity to a frequency within the range including the said transition frequency and said nontransition frequency;
   passing the resonant material through at least said first and second resonant cavities;
   exciting said first and second resonant cavities with electromagnetic oscillations corresponding in frquency to said transition and said nontransition frequency, respectively
   exciting said sealed resonant cavity with electromagnetic oscillations having a frequency within the range including said transition frequency and said nontransition frequency;
   determining a constant value of a correlating parameter between the signals within the said first resonant cavity and said sealed resonant cavity and between said second resonant cavity and said sealed resonant cavity existing in the absence of said resonant material;
   detecting the change in the value of the correlating parameter between the signals within said first resonant cavity and said sealed resonant cavity and between said second resonant cavity and said sealed resonant cavity existing in the presence of said resonant material,
   and comparing the change in the values of said correlating parameter
   so as to determine the presence and unique identity of the material.

7. A method, as in claim 6, further comprising the step of preventing shifting of the frequencies at which said first and second resonant cavities are operating of such an extent that the presence of the material would be rendered indeterminable.

8. A method, as in claim 7, wherein the step of preventing includes retuning said first and second resonant cavities to said transition and nontransition frequencies respectively prior to the shifting of the frequencies at which said first and second resonant cavities are operating of such an extent that the presence of the material would be rendered indeterminable.

9. A device for determining the presence and unique identity of materials exhibiting resonant characteristics in the presence of electromagnetic oscillations comprising:

means to generate electromagnetic oscillations;

a plurality of resonant cavity means through which the resonant material may pass and within which the resonant material may resonate, said resonant cavity means connected to said means to generate electromagnetic oscillations, and including at least a first said resonant cavity tuned to a transition frequency of the resonant material and at least a second said resonant cavity tuned to a nontransition frequency closely associated to said transition frequency; and detection means receiving said electromagnetic oscillations and detecting the values of a correlating parameter between at least said first resonant cavity and at least said second resonant cavity.

10. A device, as in claim 9, wherein said transition frequency and said nontransition frequency are frequencies in the microwave region of the electromagnetic spectrum.

11. A device, as in claim 9, further comprising alarm means to provide warning of the presence and unique identity of materials exhibiting resonance characteristics and connected to said detection means.

12. A device, as in claim 9, further comprising feedback means to stabilize said means to generate electromagnetic oscillations by feedback from said first and second microwave resonant cavities.

13. A device, as in claim 9, wherein said detection means includes at least one detector means for generating said correlating parameter and detector circuit means connected to said detection means for processing said correlating parameter.

14. A device, as in claim 9, further comprising conditioning means to prevent shifting of the frequencies at which said first and second resonant cavities are operating to such an extent that the presence of the material would be rendered indeterminable.

15. A device, as in claim 14, wherein said conditioning means includes means to condition the environment prior to its passing through said plurality of cavity means.

16. A device, as in claim 14, wherein said conditioning means includes circuit means receiving said detected values of the correlating parameter and retuning said first and second resonant cavities.

17. A device for determining the presence and unique identity of materials exhibiting resonant characteristics in the presence of electromagnetic oscillations comprising:

means to generate electromagnetic oscillations;

a plurality of resonant cavity means through which the resonant material may pass and within which the resonant material may resonate, said resonant cavity means connected to said means to generate electromagnetic oscillations and including at least a first said resonant cavity tuned to a transition frequency of the resonant material and at least a second said resonant cavity tuned to a nontransition frequency closely associated to said transition frequency;

conditioning means to prevent shifting of the frequencies at which said first and second resonant cavities are operated to such an extent that the presence of the material would be rendered indeterminable, said conditioning means including at least one sealed resonant cavity; and detection means receiving said electromagnetic oscillations and detecting the values of a correlating parameter between at least said first resonant cavity and said sealed resonant cavity, and at least said second resonant cavity and said sealed resonant cavity.

18. A device, as in claim 17, further comprising means to retun said first resonant cavity and said second resonant cavity to said transition and said nontransition frequencies respectively.

* * * * *